United States Patent [19]
Oka

[11] 4,087,779
[45] May 2, 1978

[54] PRINTED CIRCUIT AND METHOD OF MAKING

[75] Inventor: Tsumoru Oka, Wakuya, Japan

[73] Assignee: Alps Electric Co., Ltd., Tokyo, Japan

[21] Appl. No.: 734,469

[22] Filed: Oct. 21, 1976

Related U.S. Application Data

[63] Continuation of Ser. No. 428,868, Feb. 27, 1973, abandoned.

[30] Foreign Application Priority Data

Dec. 28, 1972 Japan .................................... 48-2761

[51] Int. Cl.² ............................................ H01C 1/142
[52] U.S. Cl. ..................................... 338/327; 29/620; 29/621; 174/68.5; 338/308; 338/328; 338/334
[58] Field of Search ................. 29/620, 621; 338/327, 338/328, 308, 334; 174/68.5

[56] References Cited

U.S. PATENT DOCUMENTS

| | | | |
|---|---|---|---|
| 2,662,957 | 12/1953 | Eisler | 338/328 |
| 2,758,275 | 8/1956 | Short | 361/272 X |
| 3,391,373 | 7/1968 | Altman | 338/308 |
| 3,629,782 | 12/1971 | Sahnl | 338/308 |
| 3,808,576 | 4/1974 | Castowguay | 338/309 |
| 3,848,111 | 11/1974 | Brouneus | 338/308 |

*Primary Examiner*—E. A. Goldberg
*Attorney, Agent, or Firm*—Guy W. Shoup

[57] ABSTRACT

An electronic printed circuit is produced by firstly forming an electric resistance layer on an insulating substrate at positions where resistors and conductive portions of the printed circuit are expected to be provided, and then applying a layer of electrically conductive substance over the electric resistance layer thus formed, at positions where the terminals and the conductive portions of the printed circuit are to be provided.

2 Claims, 2 Drawing Figures

PRINTED CIRCUIT AND METHOD OF MAKING

This application is a continuation application based upon the earlier filed application Ser. No. 428,868, filed Dec. 27, 1973, now abandoned, having the title Method for Producing Electronic Printed Circuit.

BACKGROUND OF THE INVENTION

This invention relates generally to a printing circuit technique, and more particularly to a method for producing electric and electronic printed circuits on an insulating substrate or insulating board.

Heretofore, for instance an electric resistor, which is an important component in a printed circuit, has been produced on an insulating board made of, for instance, a phenolic resin having a fabric reinforcement by firstly printing thereon an electric resistance layer of a shape corresponding to the resistor, and then applying an electrically conductive layer adapted to form terminals of the resistor in such a manner that these two layers are superposed on each other at both end portions of the resistance layer.

The application of the electrically conductive layer to form terminals of the resistor on the insulating substrate or board has been carried out by applying an electrically conductive paste including metal particles, such as silver particles, thereon and then drying it out to be solidified. However, there has been a tendency for the metal particles directly contacting the insulating substrate to migrate in the direction of an electric field applied thereto and along the reinforcing fabric contained in the insulating substrate. Consequently the insulation between the conductive layer portions forming the terminals of the resistor tends to be deteriorated during long period of operation until a short-circuit occurs between these portions so that the function of the resistor is substantially lost.

In order to eliminate the above described disadvantage of the prior art, a suitable resin layer has been applied on a required area of the insulating substrate, and the resistance layer and the electrically conductive layer have been applied over the resin formed layer so that the migration of the metallic particles is thereby substantially prevented. However, such a procedure has required an additional step of forming the resin layer, thus requiring additional labor and time, and this fact constitutes a drawback of the conventional practice.

SUMMARY OF THE INVENTION

With the above noted difficulty in view, a primary object of the present invention is to provide an improved method for producing electric printed circuits wherein the additional step of forming a resin layer on the substrate can be eliminated and the production cost of the printed circuits is thereby economized.

Another object of the invention is to provide an improved method for producing electric printed circuits whereby the above described migration of metallic particles through the substrate can be effectively prevented despite the elimination of the additional step of forming the underneath resin layer.

Still another object of the invention is to provide an improved method for producing electric and electronic printed circuits whereby the gaps between conductive portions in the circuits can be substantially narrowed, and hence the size of the printed circuits can be substantially minimized.

These and other objects of the present invention can be achieved by an improved method for producing an electronic printed circuit comprising the steps of forming an electric resistance layer on an insulating substrate at positions where resistors and conductive portions of the printed circuit are expected to be formed, and thereafter applying a layer of electrically conductive substance over the electric resistance layer at positions where the terminals and the conductive portions of the printed circuit are to be provided.

The nature, principle, and utility of the present invention will be better understood from the following detailed description of the invention when read in conjunction with the accompanying drawing.

DETAILED DESCRIPTION OF THE INVENTION

Figure 1:
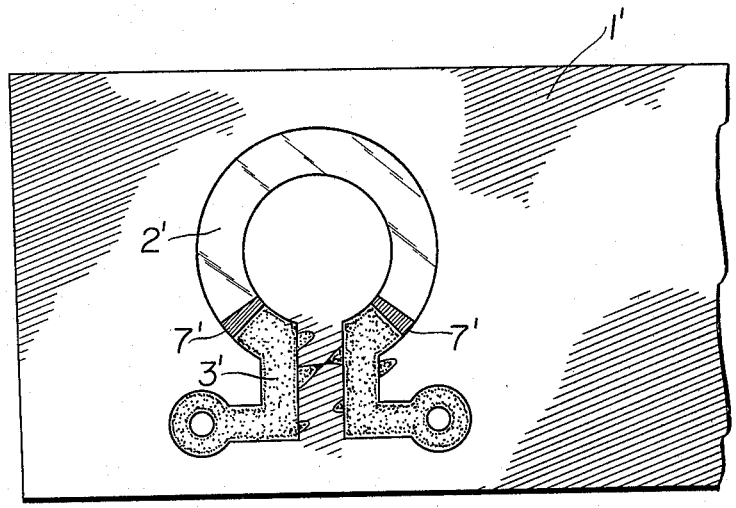
FIG. 1 is a plan view showing a conventional variable resistor formed in accordance with a conventional printing circuit technique.

For better understanding of the present invention, a conventional method for producing an electronic printed circuit will first be described with reference to FIG. 1. In the example shown in the drawing, an electric resistance layer 2' of a part annular configuration and two terminal portions made of an electrically conductive layer 3' are printed on the surface of an insulating substrate 1' made of, for instance, of phenolic resin with the two layers being partly superposed at portions 7'. The electrically conductive layer 3' is formed by firstly applying an electrically conductive paste containing, for instance, silver particles onto a substrate and then drying it out to be solidified. For this reason, if the metal particles of, for instance, silver directly contact the insulating substrate made of a phenolic resin, the metal particles tend to be migrated along the reinforcing fabric contained in the insulating substrate under an influence of electric field, so that the insulation between the two terminal portions tends to be deteriorated during a long period of operation until the two terminal portions are ultimately short-circuited and the function of the variable resistor is thereby lost.

Although the above described shortcoming has been overcome by applying a layer of suitable resin onto the substrate at portions underlying the conductive-layer portions, such an additional step has raised the manufacturing cost of the printed circuit board as described hereinbefore.

The above described drawbacks of the conventional methods for producing electronic printed circuit board are eliminated in an improved method according to the present invention which will now be described with reference to FIG. 2.

Figure 2:
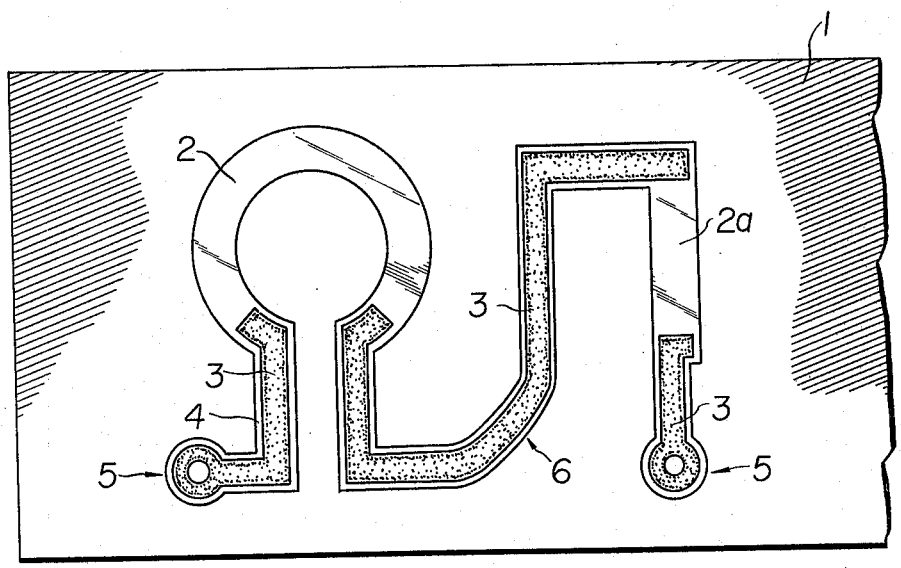
FIG. 2 is a plan view showing an example of the printed circuit produced by the method in accordance with the present invention.

According to the method clearly indicated in FIG. 2, a layer 2 of a mixture of carbon and a plastic resin (carbon-resin series substance) and having an electrically resistive nature is firstly applied onto an insulating substrate 1 made of, for instance, a phenolic resin at positions where not only the resistance portions of resistors but also the conductive portions of the printed circuit are to be provided. Thereafter, a layer 3 of an electrically conductive paste containing, for instance, silver particles is applied over the above-mentioned electrically resistive layer 2 at positions where conductive parts inclusive of the terminals of the resistors are to be provided, such that marginal areas 4 consisting of the electrically resistive layer 2 are left around the layer portions 3 consisting of the electrically conductive paste. With this construction, the electrically conductive layer portions 3 do not contact the insulating substrate 1 directly.

Since the electrically conductive portions 3 provided over the electrically resistive layer 2 do not directly contact the insulating substrate 1 made of, for instance, a phenolic resin or an epoxide resin, the hereinbefore described migration of the metal particles along the reinforcing fabric in the direction of an electric field can be prevented. Furthermore, the additional step of applying a preliminary coating on the substrate 1 can be eliminated, and the printing can be accomplished by the two simple steps of applying a resistive layer and a conductive layer on the substrate.

Thus, the production cost of the electronic printed circuit can be economized since an additional steps is not required, and the operational life of the printed circuit can be elongated because the insulation between the conductive portions 3 is not deteriorated over a long period of operation. It should be noted that merely an example including an annular resistance portion 2, a linear resistance portion 2a, two terminals 5 for outer connection, and some interconnecting conductive portions 3 is indicated schematically in FIG. 2.

As will be apparent from the above description, the gaps between the conductive portions in the printed circuit according to the present invention can be selected to be far narrower than the gaps in the conventional printed circuits, whereby the size of the entire printed circuit can be substantially minimized. Although the invention has been described with respect to an example wherein the insulating substrate is made of a phenolic resin or an epoxide resin, it will be apparent for those skilled in the art that the invention is likewise applicable to an example wherein the insulating substrate is made of a ceramic material.

I claim:
1. A method of producing an electronic printed circuit, comprising the steps of:
 (a) forming and coating a flat band of resistance material of a carbon-resin series substance directly on an insulating substrate having fiber reinforcement, the width of said resistance material being less than the width of said insulating substrate, so as to leave a margin of said insulating substrate around said resistance material, the end portions of said resistance band defining terminal portions;
 (b) applying electrically conducting material over at least two areas of said resistance band and in direct electrical contact therewith, portions of two areas of said conducting material being inclusive of the terminal portions in said flat band of resistance material, the width of said conducting material being smaller than the width of said resistance material so as to leave a margin of exposed resistance material around said conducting material;
 (c) whereby there is formed a barrier to counteract electric field migration of particles of said conducting material along the reinforcing fibers of said insulating substrate.

2. A printed circuit, comprising:
 (a) a flat insulating substrate having fiber reinforcement;
 (b) a flat band of resistance material of a carbon-resin series substance directly coated on and adhered to said insulating substrate, the end portions of said resistance band defining terminal portions;
 (c) at least two conducting material means in physical contact with said terminal portions;
 (d) each of said conducting material means being of a smaller width than the resistance band so as to leave a margin of said resistance material extending beyond said conducting material;
 (e) whereby there is formed a barrier to counteract electric field migration of particles of said conducting material along the reinforcing fibers of said insulating substrate.

* * * * *